(12) United States Patent
Kwak et al.

(10) Patent No.: US 8,098,005 B2
(45) Date of Patent: Jan. 17, 2012

(54) WHITE LIGHT EMITTING DEVICE

(75) Inventors: Chang Hoon Kwak, Seoul (KR); Young Mok Lee, Gyunggi-do (KR); Il Woo Park, Gyunggi-do (KR); Jong Rak Sohn, Gyunggi-do (KR); Chul Soo Yoon, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 906 days.

(21) Appl. No.: 12/007,925

(22) Filed: Jan. 17, 2008

(65) Prior Publication Data

US 2010/0283382 A1    Nov. 11, 2010

(30) Foreign Application Priority Data

Feb. 20, 2007    (KR) .................. 10-2007-0017173

(51) Int. Cl.
*H05B 33/14* (2006.01)
(52) U.S. Cl. ...................... 313/503; 313/512
(58) Field of Classification Search ............ 257/40, 257/72, 98–100, 642–643, 759; 313/498–512; 315/169.1, 169.3; 427/58, 64, 66, 532–535, 427/539; 428/690–691, 917; 438/26–29, 438/34, 82; 445/24–25
See application file for complete search history.

(56) References Cited

U.S. PATENT DOCUMENTS

| | | | |
|---|---|---|---|
| 5,847,507 A * | 12/1998 | Butterworth et al. | 313/512 |
| 5,958,591 A * | 9/1999 | Budd | 428/403 |
| 6,066,861 A * | 5/2000 | Hohn et al. | 257/99 |
| 6,277,301 B1 | 8/2001 | Hohn et al. | |
| 6,379,584 B1 * | 4/2002 | Yocom et al. | 252/301.4 S |
| 6,417,019 B1 | 7/2002 | Mueller et al. | |
| 6,419,854 B1 * | 7/2002 | Yocom et al. | 252/301.4 S |
| 6,555,255 B2 * | 4/2003 | Barton et al. | 428/690 |
| 6,580,097 B1 | 6/2003 | Soules et al. | |
| 6,656,608 B1 | 12/2003 | Kita et al. | |
| 6,696,703 B2 * | 2/2004 | Mueller-Mach et al. | 257/98 |
| 2002/0037429 A1 * | 3/2002 | Sato et al. | 428/690 |
| 2005/0200271 A1 | 9/2005 | Juestel et al. | |
| 2005/0227569 A1 * | 10/2005 | Maeda et al. | 445/25 |
| 2006/0145123 A1 * | 7/2006 | Li et al. | 252/301.4 F |
| 2006/0159853 A1 | 7/2006 | Chung et al. | |
| 2007/0012931 A1 * | 1/2007 | Lee et al. | 257/89 |

(Continued)

FOREIGN PATENT DOCUMENTS

CN    1621490 A    6/2005

(Continued)

OTHER PUBLICATIONS

Chinese Office Action, w/ English translation thereof, issued in Chinese Patent Application No. CN 200810001864X dated Oct. 23, 2009.

(Continued)

*Primary Examiner* — Nimeshkumar Patel
*Assistant Examiner* — Donald Raleigh
(74) *Attorney, Agent, or Firm* — McDermott Will & Emery LLP

(57) ABSTRACT

A white light emitting device including: a blue light emitting diode (LED); a green silicate phosphor formed on the blue LED; and a red sulfide phosphor with a surface coated with a silicone oxide layer, the red sulfide phosphor formed on the blue LED.

8 Claims, 6 Drawing Sheets

U.S. PATENT DOCUMENTS

| | | | |
|---|---|---|---|
| 2007/0046169 A1* | 3/2007 | Maeda et al. | 313/487 |
| 2007/0057626 A1* | 3/2007 | Kurihara et al. | 313/503 |
| 2008/0149957 A1 | 6/2008 | Kameshima et al. | |
| 2008/0185600 A1* | 8/2008 | Thomas | 257/98 |

FOREIGN PATENT DOCUMENTS

| | | |
|---|---|---|
| JP | 2001-143869 A | 5/2001 |
| JP | 2002-531956 | 2/2002 |
| JP | 2006-188700 | 7/2006 |
| KR | 10-2003-0060697 A | 7/2003 |
| KR | 2004-0092141 A | 11/2004 |
| KR | 2006-0079746 A | 7/2006 |
| KR | 1020060079746 * | 7/2006 |
| WO | WO 2006/077740 A1 | 7/2006 |
| WO | WO 2006/118389 A1 | 11/2006 |

OTHER PUBLICATIONS

Japanese Office Action, with English translation, issued in Japanese Patent Application No. 2008-000791, dated Jul. 6, 2010.

HL Park, et al., "Physics of Alkaline-Earth Sulfide Phosphors", Chinese Journal Phys, Feb. 1990, vol. 28, Issue 1, p. 105.

Nazarov, Mihail, et al., "Controlled peak wavelength shift of Ca1-xSrx(SySe1-y):Eu2+ phosphor for LED application", May 4, 2006, pp. 2529-2533, 179, Journal of Solid State Chemistry, Elsevier.

Japanese Office Action, w/ English translation thereof, issued in Japanese Patent Application No. 2008-000791, dated Oct. 25, 2011.

* cited by examiner

WHITE LIGHT EMITTING DEVICE

CROSS-REFERENCE TO RELATED APPLICATIONS

This application claims the priority of Korean Patent Application No. 2007-0017173 filed on Feb. 20, 2007, in the Korean Intellectual Property Office, the disclosure of which is incorporated herein by reference.

BACKGROUND OF THE INVENTION

1. Field of the Invention

The present invention relates to a white light emitting device, and more particularly, to a white light emitting device using a light emitting diode (LED) and having high color reproducibility and high reliability.

2. Description of the Related Art

As a next generation light source product for replacing a conventional light source such as a fluorescent lighting or a backlight source of a liquid crystal display (LCD) display, light emitting diodes (LEDs) with low power consumption and excellent light efficiency receive attentions. To variously apply LEDs with high efficiency, there have been performed a lot of researches on white light emitting devices using an LED. As a method of embodying a white light using LEDs, there is generally used a method of coating blue LED with a yellow phosphor.

However, in the case of white light emitting devices using a blue LED and a yellow phosphor, since there is no definite distinction between green and red wavelength areas and a light intensity in a long wavelength area is very low, color reproducibility is not high enough. Due to this, white light emitting devices using a blue LED and a yellow phosphor are not suitable for products requiring high color reproducibility, such as a color screen of a mobile phone and an LCD display for a computer monitor.

FIG. 1A is a diagram illustrating a light emitting spectrum of a conventional white light emitting device using an LED. The light emitting spectrum relates to a white light outputted from a white light emitting device including a blue LED and an yttrium aluminum garnet (YAG)-based yellow phosphor excited by the blue LED. As shown in FIG. 1A, in the spectrum, not only there is no definite distinction but also there is shown a relatively low light intensity in a long wavelength area such as a red wavelength area. Such light emitting spectrum characteristics are disadvantageous in an aspect of color reproduction.

FIG. 1B is a diagram illustrating spectrums obtained when transmitting a white light having the spectrum of FIG. 1 to blue, green, and red color filters. As shown in FIG. 1B, though separating the white light into blue, green, and red spectrums by using the color filters, there is a considerable overlap portion between a green light spectrum and a red light spectrum. In addition, the red light spectrum separated by the red color filter has a considerably low relative intensity in a wavelength of 600 nm or more. Accordingly, when using the white light having the spectrum of FIG. 1A as a backlight of an LCD display, the LCD display shows color reproducibility not enough. Actually, when using a mixture of a blue InGaN-based LED and a YAG-based phosphor as a light source for a backlight, there is embodied just color reproducibility of about 60 to 65%, comparing with national television system committee (NTSC). It is difficult to express various colors by using the color reproducibility of such degrees.

In addition to the described mixture of a blue LED and a yellow phosphor, there is provided a white light emitting device using a mixture of a blue LED and red and green phosphors. When using the red and green phosphors as described above, color reproducibility thereof is increased to some degrees. However, this is not enough. Also, due to instability of phosphor materials, such as a damage caused by external energy, red or green phosphors generally used for white light emitting devices are unreliable.

Particularly, sulfide phosphors having a relatively high brightness and a wide color distribution has excellent optical properties. However, there is a problem in material stability, where a structure there is easily destroyed. For example, a red sulfide phosphor such as SrS:Eu may react to a platinum catalyst added in a silicone resin or an epoxy resin for encapsulation. Also, when exposed to humidity, there may be generated a corrosive gas having a bad effect on products. A red oxide phosphor such as $Gd_2O_3$:Eu may be considered instead of the red sulfide phosphor. However, such red oxide phosphor has a low brightness and a narrow color distribution. Accordingly, a white light emitting device using the red oxide phosphor is incapable of embodying a desirable brightness and color reproducibility.

SUMMARY OF THE INVENTION

An aspect of the present invention provides a white light emitting device capable of embodying more improved color reproducibility and having stability of phosphor materials and excellent reliability.

According to an aspect of the present invention, there is provided a white light emitting device including: a blue light emitting diode (LED); a green silicate phosphor formed on the blue LED; and a red sulfide phosphor with a surface coated with a silicon oxide layer, the red sulfide phosphor formed on the blue LED.

The green silicate phosphor may include Eu-doped (Ba, Sr, Ca, $Mg)_2SiO_4$, and the red sulfide phosphor may include Eu-doped (Ca, Sr) (S, Se):Eu.

The green silicate phosphor may include (Ba, Sr, Ca, $Mg)_2SiO_4$:Eu, Re, the Re that is one or more rare-earth elements selected from a group consisting of Ce, Pr, Sm, Gd, Tb, Dy, Ho, and Er. Also, the red sulfide phosphor may include (Ca, Sr) (S, Se):Eu, Re', the Re' that is one or more rare-earth elements selected from a group consisting of Ce, Pr, Sm, Gd, Tb, Dy, Ho, and Er.

The green silicate phosphor may have a peak wavelength of 520 to 550 nm, and the red sulfide phosphor may have a peak wavelength of 630 to 660 nm. The green silicate phosphor may have a full width at half maximum (FWHM) of 30 to 90 nm, and the red sulfide phosphor may have an FWHM of 40 to 100 nm.

The red sulfide phosphor with a coated surface may include red sulfide phosphor particles, a silicon oxide layer formed on the red sulfide phosphor particles, and a buffer layer bonded between the red sulfide phosphor particles and the silicon oxide layer and containing sulfur and a hydrocarbon radical. The hydrocarbon radical may be an alkyl group.

The white light emitting device may further include a resin encapsulation portion encapsulating the blue LED. In this case, the green silicate phosphor and the red sulfide phosphor with a coated surface may be dispersed in the resin encapsulation portion.

The green silicate phosphor and the red sulfide phosphor may be formed of one of a single phosphor layer and a multilayer phosphor layer on the blue LED.

The white light emitting device may further include a package body having a reflective cup. In this case, the blue LED may be mounted on the reflective cup of the package body.

The whiter light emitting device may further include a resin encapsulation portion having a lens concave upwardly and encapsulating the blue LED.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
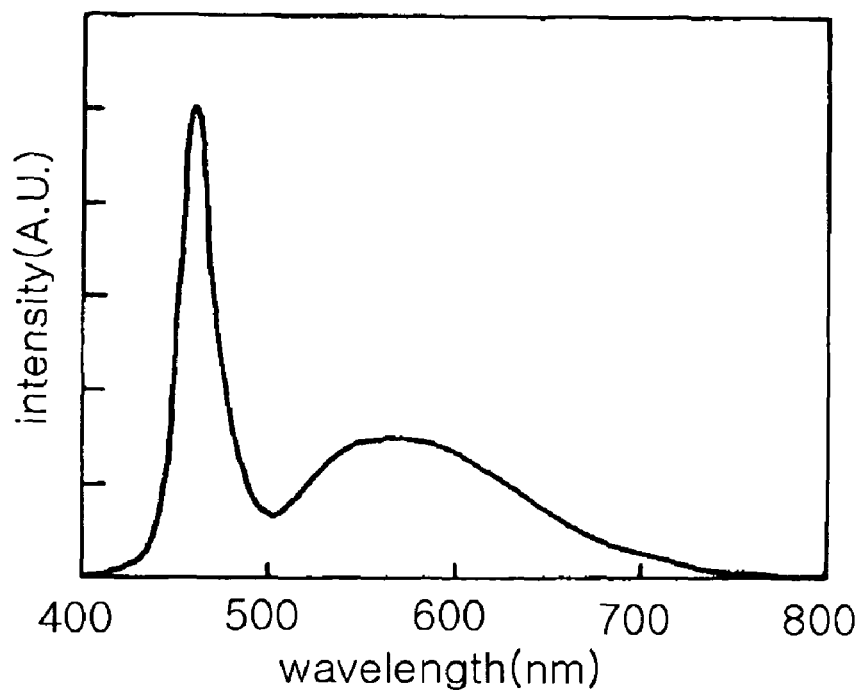
FIG. 1A is a diagram illustrating a light emitting spectrum of a conventional white light emitting device.
Figure 1B:
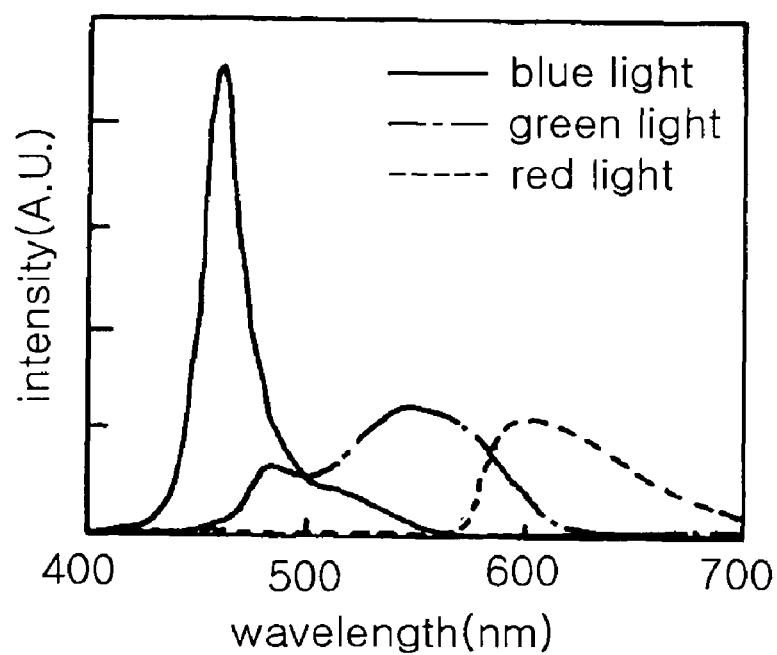
FIG. 1B is a diagram illustrating spectrums obtained when separating light outputted from the conventional white light emitting device by using a blue, green, and red color filters.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity.

Figure 2A:
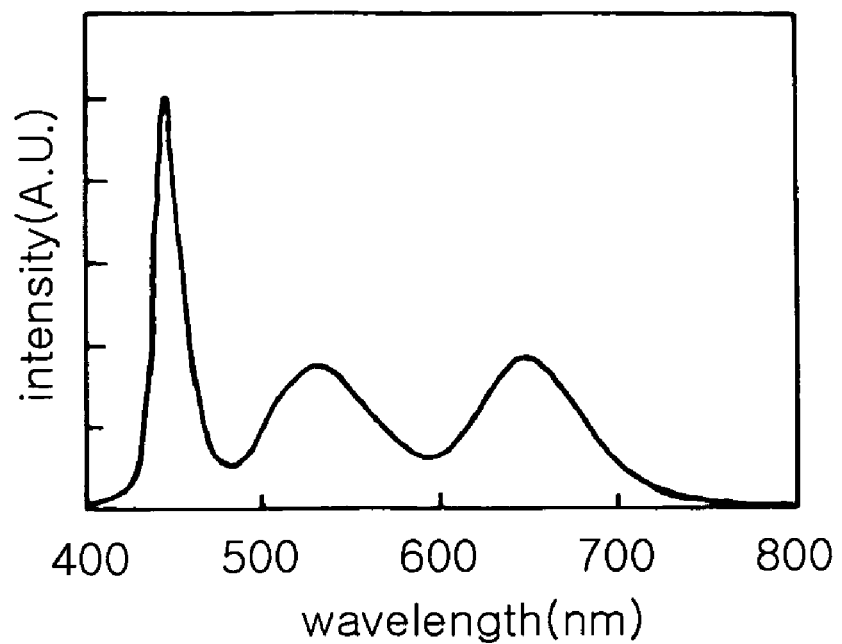
FIG. 2A is a diagram illustrating a light emitting spectrum of a white light emitting device according to an exemplary embodiment of the present invention.

FIG. 2A is a diagram illustrating a light emitting spectrum of a white light emitting device according to an exemplary embodiment of the present invention. The light emitting spectrum of FIG. 2A is obtained by the white light emitting device using a blue light emitting diode (LED) and a mixture of a green silicate phosphor of Eu-doped $(Ba, Sr, Ca, Mg)_2SiO_4$ and a red sulfide phosphor of Eu-doped $(Ca, Sr)(S, Se)$. For stability of a material, Eu-doped $(ca, Sr)(S, Se)$ that is the red sulfide phosphor is previously surface coated with a silicone oxide layer. Particularly, an InGaN-based LED is used as the blue LED, Eu-doped $(Ba, Sr, Ca, Mg)_2SiO_4$ is used as the green silicate phosphor, and Eu-doped $(ca, Sr)(S, Se)$ with a surface coated with the silicon oxide layer is used as the red sulfide phosphor, thereby obtaining the spectrum of FIG. 2A.

Figure 5:
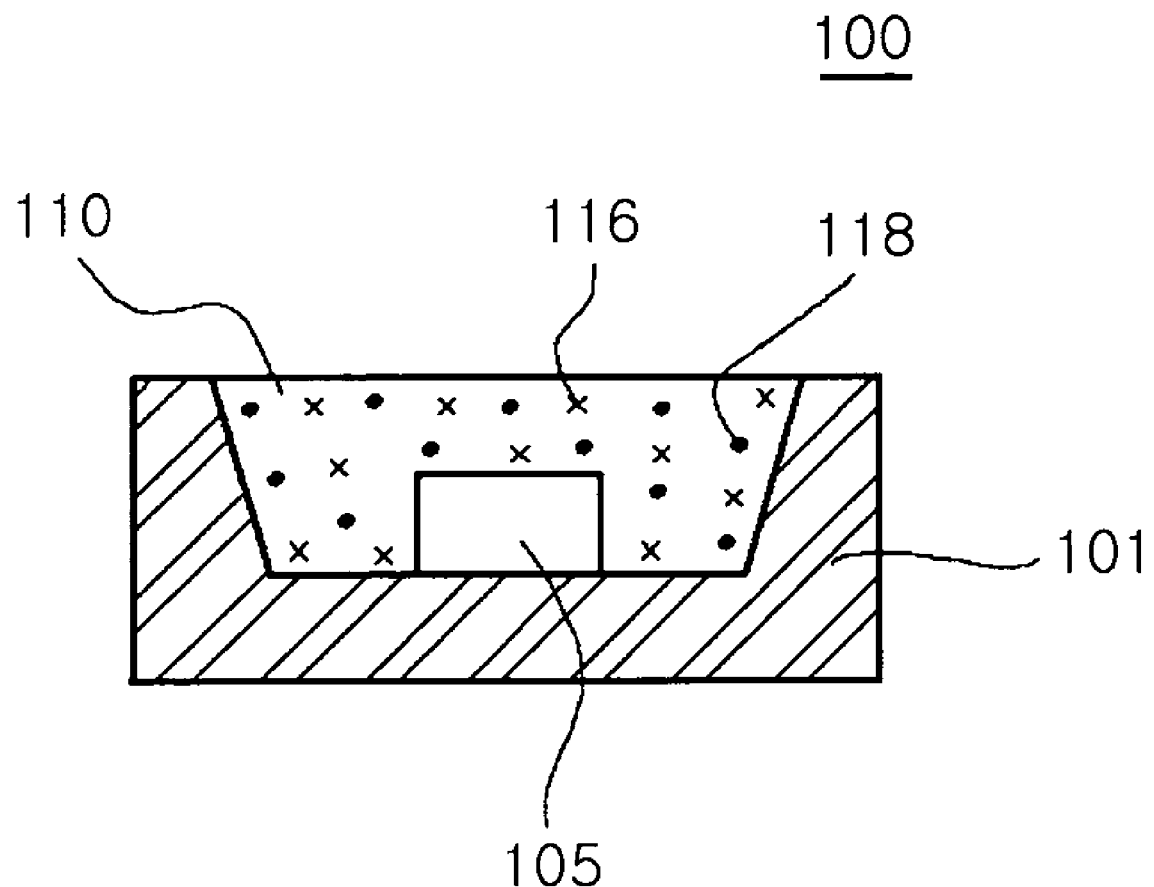
FIG. 5 is a cross-sectional view illustrating a white light emitting device according to an exemplary embodiment of the present invention.

The silicate phosphor of Eu-doped $(Ba, Sr, Ca, Mg)_2SiO_4$ may be excited by a blue light and may have a peak wavelength of 520 to 550 nm and a full width at half maximum (FWHM) of 30 to 90 nm. Also, the sulfide phosphor of Eu-doped $(Ca, Sr)(S, Se)$ is excited by the blue light and may have a peak wavelength of 630 to 660 nm and an FWHM of 40 to 100 nm. A white light spectrum embodying high color reproducibility may be obtained by using such green and red phosphors (refer to FIG. 2A). In this case, to the respective phosphors, together with Eu, there may be additionally added one or more rare-earth elements selected from a group consisting of Ce, Pr, Sm, Gd, Tb, Dy, Ho, and Er. As below, detailed examples of a structure of a white light emitting device are illustrated in FIGS. 5 and 6.

Referring to FIG. 2A, different from a light emitting spectrum of a conventional device using an yttrium aluminum garnet (YAG)-based phosphor (refer to FIG. 1A), the light emitting spectrum has a red area and green area distinguished from each other with an enough light intensity. Also, a long wavelength area of 600 nm or more shows an enough relative intensity. As shown in FIG. 2A, the spectrum has peak wavelengths of blue, green, and red areas within ranges of 430 to 450 nm, 510 to 540 nm, and 635 to 655 nm, respectively. Comparing with a light intensity of the peak wavelength of the blue area, relative intensities of the peak wavelengths of the green and red areas are about 35% or more. Particularly, there is shown a clear red peak wavelength around 650 nm. Such light intensity distribution and the peak wavelengths allow notably improved color reproducibility to be obtained.

Figure 2B:
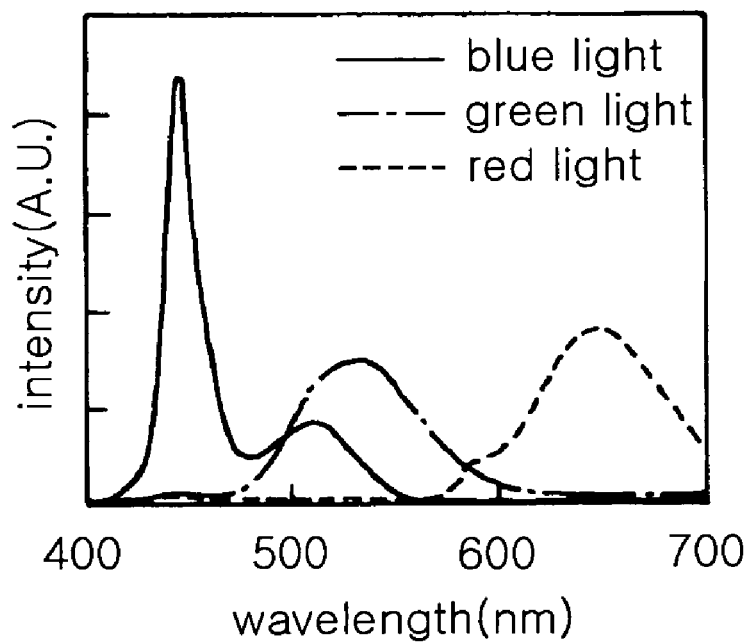
FIG. 2B is a diagram illustrating spectrums obtained when separating light outputted from the white light emitting device according to an exemplary embodiment of the present invention by using a blue, green, and red color filter.

FIG. 2B illustrates spectrums of the respective R, G, and B separated by transmitting the white light showing the spectrum of FIG. 2A into blue, green, and red color filters. The color filters are used in a liquid crystal display (LCD) display. As shown in FIG. 2B, the blue light spectrum, green light spectrum, and red light spectrum, separated by the three primary color filters, have peak wavelengths and relative intensities of peaks, approximately similar to the respective RGB wavelength areas of the white light spectrum before separation (refer to FIG. 2A).

That is, the blue, green, and red light spectrums obtained by transmitting into the respective color filters have peak wavelengths approximately identical to the peak wavelengths of the respective RGB areas of the white light before transmission, with only a negligible peak wavelength shift. Also, a relative intensity at each peak after color filter transmission is approximately identical to the relative intensity at the peak of each of the RGB wavelength areas of the white light. Accordingly, using the primary three color lights obtained after color filter transmission, high color reproducibility of about 80% or more, comparing with national television system committee (NTSC). Such color reproducibility is notably improved, comparing with a conventional LED-phosphor mixture. It is possible to express various colors close to natural colors.

A green silicate phosphor $(Ba, Sr, Ca, Mg)_2SiO_4$:Eu and a red sulfide phosphor $(Ca, Sr)(S, Se)$:Eu, assembled with a blue LED, may be used in various compositions according to requirements. For example, a composition ratio of Ba, Sr, Ca, and Mg in the green phosphor is varied or a composition ratio of S and Se in the red phosphor is varied, thereby controlling light emitting characteristics within a certain range.

Also, another rare-earth element in addition to Eu may be added to the green silicate phosphor $(Ba, Sr, Ca, Mg)_2SiO_4$:Eu and the red sulfide phosphor $(Ca, Sr)(S, Se)$:Eu. For example, one or more rare-earth elements selected from a group consisting of Ce, Pr, Sm, Gd, Tb, Dy, Ho, and Er. As $(Ba, Sr, Ca, Mg)_2SiO_4$:Eu, Ce or $(Ca, Sr)(S, Se)$:Eu, Pr, Ce or Pr may be added as an auxiliary activator in addition to Eu.

Since a red sulfide phosphor itself easily reacts to external humidity and energy, to restrain such instability of a material, a surface of the red sulfide phosphor is previously coated with a silicon oxide layer before using. Particularly, when applying a surface coating method disclosed in Korean Patent Application No. 2005-012736 filed prior to the filing of the present invention by the present applicant, a silicon oxide surface coating strongly bonded to a sulfide may be formed.

Figure 3A:
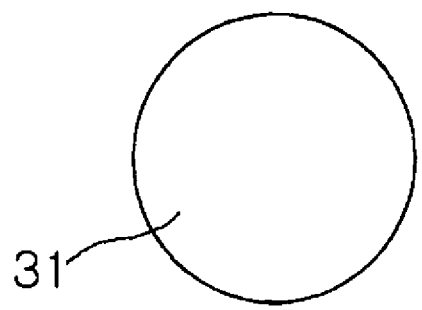
FIGS. 3A to 3C are mimetic diagrams illustrating a process of forming a film of a red sulfide phosphor, the method capable of being applied to the present invention.
Figure 3B:
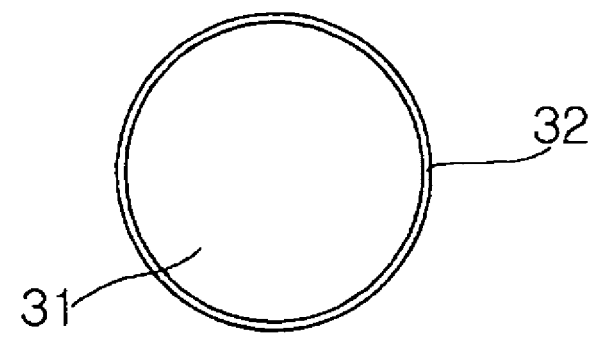
Figure 3C:
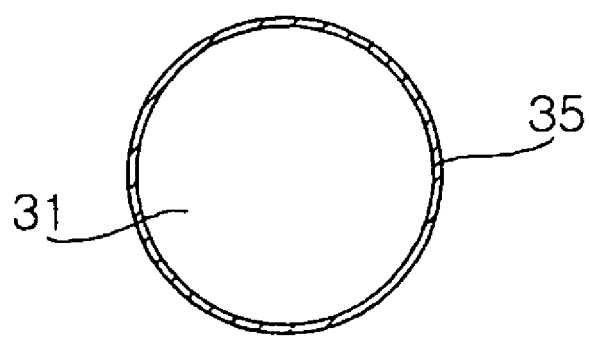

FIGS. 3A to 3C are mimetic diagrams illustrating a surface coating method capable of being applied to a red sulfide phosphor.

Referring to FIG. 3A, a powder of red sulfide phosphor particles 31 of Eu-doped (Ca, Sr) (S, Se) is prepared before surface coating. As shown in FIG. 3B, an organic high polymer film is formed by applying a silane-based modifier, particularly, a liquid type, to the phosphor powder. For example, when using a mercapto group silane-based modifier, "—SH" group of an end of a functional group of the modifier may react to a sulfur on a surface of Eu-doped (Ca, Sr) (S, Se) phosphor particles 31 and form an organic high polymer film 32 on the surface of the phosphor particles 31 while maintaining stable bonding therebetween. As the silane-based modifier, there is a silane-based modifier capable of reacting and being bonded to the sulfur on the surface of the phosphor particles 31, the silane-based modifier including a silane selected from a group consisting of an alkyl silane, an alkoxy silane, a methyl silane, a methoxy silane, a hydroxy silane, and a composition thereof.

As shown in FIG. 3C, to obtain a silicon oxide layer 35 from the organic high polymer film 32, the phosphor with the organic high polymer film 32 is heated at a temperature from 200 to 600° C., thereby obtaining the silicon oxide layer 35 densely bonded to the entire surface of he phosphor particles 31. The silicon oxide layer 35 is capable of effectively preventing a reaction between Pt that is a hardening catalyst and the sulfide phosphor particles 31. According to embodiments, between the silicon oxide layer 35 and the phosphor particles 31, a thin buffer layer containing S and a hydrocarbon group such as an alkyl group may be formed. The buffer layer allows the silicon oxide layer 35 to be strongly bonded to the phosphor particles 31.

Figure 4:
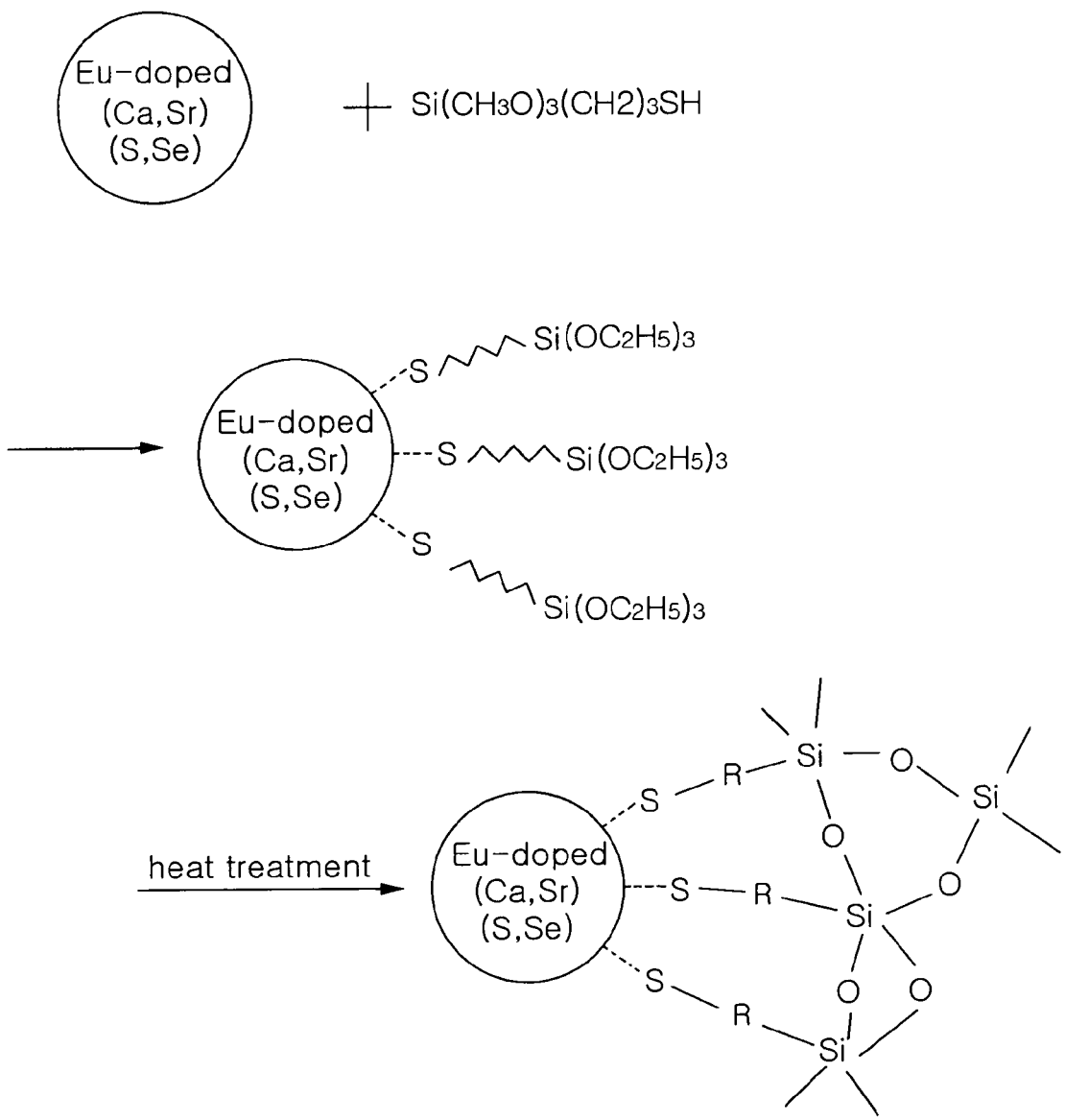
FIG. 4 is a schematic diagram illustrating an example of forming the film of FIG. 3.

FIG. 4 is a diagram illustrating the process of coating the surface of the red sulfide phosphor particles of FIG. 3, in detail.

Referring to FIG. 4, Eu-doped (Ca, Sr) (S, Se) is allowed to react to 3 (mercaptopropyl) trimethoxysilane (TMS), thereby bonding S (not shown) on the surface of the Eu-doped (Ca, Sr) (S, Se) particles to SH group of the TMS. Accordingly, an organic high polymer film of Si $(OC_2H_5)_3$ is formed on the surface of the Eu-doped (Ca, Sr) (S, Se) particles.

The buffer layer S—R and a silicon oxide layer SiO2 are formed on the surface of the Eu-doped (Ca, Sr) (S, Se) particles by a heat treatment. The buffer layer S—R contains S and the alkyl group R and is bonded to the phosphor particles 31. Also, the silicon oxide layer $SiO_2$ is strongly bonded to the buffer layer S—R. Accordingly, a surface-coated red sulfide phosphor of Eu-doped (Ca, Sr) (S, Se) strongly bonded to the silicon oxide layer is obtained. The silicon oxide layer $SiO_2$ effectively protects the sulfide phosphor from external humidity, a hardening catalyst such Pt, and other external environments. Accordingly, it is possible to stably provide good optical characteristics of the red sulfide phosphor.

Also, using a green silicate phosphor such as (Ba, Sr, Ca, Mg)$_2$SiO$_4$:Eu, stability of a green phosphor material may be improved. The green silicate phosphor may not only keep a stable state from external humid, a hardening catalyst such Pt, and other external environments but also provide excellent color reproducibility by being used with the red sulfide phosphor. Also, the green silicate phosphor may provide more excellent material reliability than that of the surface-coated red sulfide phosphor.

FIG. 5 is a cross-sectional view illustrating a white light emitting device 100 according to an exemplary embodiment of the present invention. Referring to FIG. 5, the white light emitting device 100 includes a package body 101 with a reflective cup formed on a center thereof and a blue LED 105 mounted on a bottom of the reflective cup. In the reflective cup, a transparent resin encapsulation portion 110 encapsulates the blue LED 105. The resin encapsulation portion 110 may be formed of one of a silicone resin, an epoxy resin, a hybrid resin, and polyvinyl resin.

In the resin encapsulation portion 110, a green silicate phosphor 116 of Eu-doped (Ba, Sr, Ca, Mg)$_2$SiO$_4$ and a red sulfide phosphor 118 of Eu-doped (Ca, Sr) (S, Se) surface-coated with a silicone oxide layer are uniformly distributed. On the bottom of the reflective cup, a conductor (not shown) for connection such as a lead is formed and connected to an electrode of the blue LED 105 by wire bonding or flip chip bonding.

A blue light emitted from the blue LED 105 excites the green silicate phosphor 116 of Eu-doped (Ba, Sr, Ca, Mg)$_2$SiO$_4$ and the red sulfide phosphor 118 of Eu-doped (Ca, Sr) (S, Se) in such a way that a green light and a red light are emitted from the green silicate phosphor 116 and the red sulfide phosphor 118. The green light and red light are mixed with the blue light from the blue LED 105 to output a white light with high color reproducibility. Also, as described above, the green silicate phosphor 116 and the red sulfide phosphor 118 allow the white light emitting device to provide high stability and reliability by material stability of a silicate itself and surface coating with the silicon oxide layer.

Figure 6A:
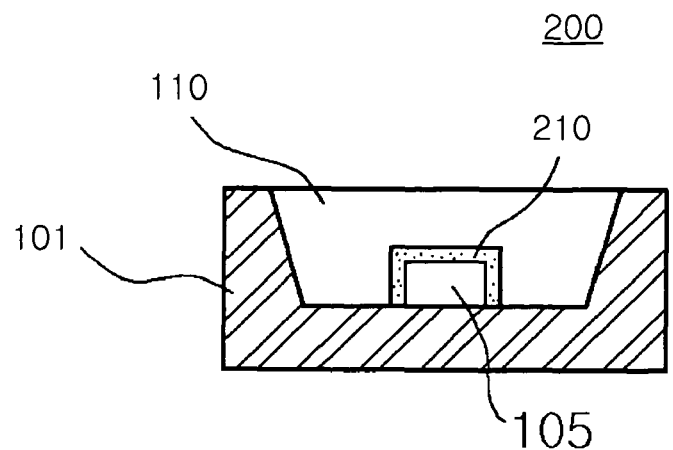
FIGS. 6A to 6C are cross-sectional views illustrating white light emitting devices according to various embodiments of the present invention.
Figure 6B:
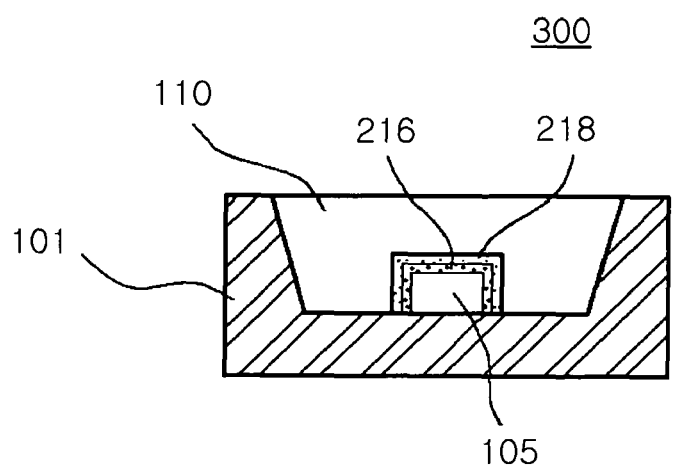
Figure 6C:
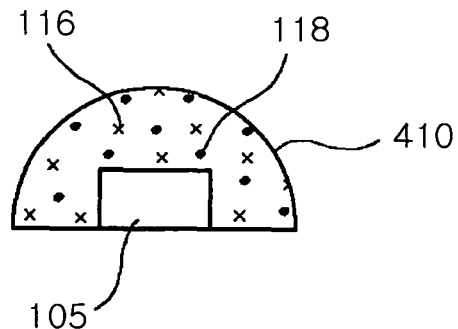

The white light emitting device 100 is one of embodiments of the present invention, and other package structures may be employed. FIGS. 6A to 6C are cross-sectional views illustrating white light emitting devices 200 to 400 according to various embodiments of the present invention.

In the white light emitting devices 200 and 300 of FIGS. 6A and 6B, instead of the phosphors 116 and 118 distributed in the resin encapsulation portion 110, there are provided phosphor layers 210, 216, and 218 coating the surface of the blue LED 105. Particularly, in the white light emitting device 200 of FIG. 6A, the green and red phosphors 116 and 118 are distributed in one a phosphor layer structure 210. However, in the white light emitting device 300 of FIG. 6B, the phosphor layers 216 and 218 are provided to form a multilayer structure. It is not required to directly coat the surface of the blue LED 105 with such phosphor layers. For example, the phosphor layers may be disposed in a position separate from the surface of the blue LED 105, such as on a top surface of the resin encapsulation portion 110. Also, it is not required that the phosphor layers 216 and 218 should be in contact with each other.

FIG. 6C illustrates the white light emitting device 400. Without additional package body 101, a resin encapsulation portion 410 formed in an upwardly convex lens shape such as a hemisphere shape covers the blue LED 105. In the resin encapsulation portion 410, the green silicate phosphor and the red sulfide phosphor are distributed. The blue LED 105 is directly mounted on a circuit board (not shown), thereby embodying a chip on board (COB) LED package having a wide far field beam distribution. In the present embodiment, it is not required to distribute the phosphors in the resin encapsulation portion 410. For example, the phosphors are provided in the form of phosphor layers.

As described above, according to an exemplary embodiment of the present invention, there is provided a white light emitting device having greatly improved color reproducibility and reliability thereof by using a green silicate phosphor and a red sulfide phosphor surface coated with a silicone oxide layer. By using the white light emitting device, an LCD display with improved color quality and reliability may be embodied.

While the present invention has been shown and described in connection with the exemplary embodiments, it will be apparent to those skilled in the art that modifications and variations can be made without departing from the spirit and scope of the invention as defined by the appended claims.

What is claimed is:

1. A white light emitting device comprising:
    a blue light emitting diode (LED);
    a green silicate phosphor formed on the blue LED; and
    a red sulfide phosphor with a surface coated with a silicon oxide layer, the red sulfide phosphor formed on the blue LED,
    wherein the green silicate phosphor comprises Eu-doped $Mg_2SiO_4$:Eu, Re, the Re that is one or more rare-earth elements selected from a group consisting of Ce, Pr, Sm, Gd, Tb, Dy, Ho, and Er, and
    wherein the red sulfide phosphor comprises (Ca, Sr) (S, Se):Eu, Re', the Re' that is one or more rare-earth elements selected from a group consisting of Pr, Gd, Tb, Dy, Ho, and Er.

2. The white light emitting device of claim 1, wherein the green silicate phosphor has a peak wavelength of 520 to 550 nm and the red sulfide phosphor has a peak wavelength of 630 to 660 nm, and
    the green silicate phosphor has a full width at half maximum (FWHM) of 30 to 90 nm and the red sulfide phosphor has an FWHM of 40 to 100 nm.

3. The white light emitting device of claim 1, wherein the red sulfide phosphor with a coated surface comprises:
    red sulfide phosphor particles;
    a silicon oxide layer formed on the red sulfide phosphor particles; and
    a buffer layer bonded between the red sulfide phosphor particles and the silicon oxide layer and containing sulfur and a hydrocarbon radical.

4. The white light emitting device of claim 3, wherein the hydrocarbon radical is an alkyl group.

5. The white light emitting device of claim 1, further comprising a resin encapsulation portion encapsulating the blue LED,
    wherein the green silicate phosphor and the red sulfide phosphor with a coated surface are dispersed in the resin encapsulation portion.

6. The white light emitting device of claim 1, further comprising a package body having a reflective cup,
    wherein the blue LED is mounted on the reflective cup of the package body.

7. The white light emitting device of claim 1, wherein the green silicate phosphor and the red sulfide phosphor with a coated surface are provided in the form of one of a single phosphor layer and a multilayer phosphor layer on the blue LED.

8. The white light emitting device of claim 1, further comprising a resin encapsulation portion having a lens convex upwardly and encapsulating the blue LED.

* * * * *